(12) United States Patent
Frank et al.

(10) Patent No.: US 7,936,885 B2
(45) Date of Patent: May 3, 2011

(54) AUDIO/VIDEO REPRODUCING SYSTEMS, METHODS AND COMPUTER PROGRAM PRODUCTS THAT MODIFY AUDIO/VIDEO ELECTRICAL SIGNALS IN RESPONSE TO SPECIFIC SOUNDS/IMAGES

(75) Inventors: Scott M. Frank, Dunwoody, GA (US);
Robert J. Starr, Decatur, GA (US);
Steven Tischer, Atlanta, GA (US);
Samuel N. Zellner, Dunwoody, GA (US)

(73) Assignee: AT&T Intellectual Property I, LP, Reno, NV (US)

( * ) Notice: Subject to any disclaimer, the term of this patent is extended or adjusted under 35 U.S.C. 154(b) by 1536 days.

(21) Appl. No.: 11/294,817

(22) Filed: Dec. 6, 2005

(65) Prior Publication Data
US 2007/0127879 A1    Jun. 7, 2007

(51) Int. Cl.
*H03G 3/20* (2006.01)
*H03G 3/00* (2006.01)
*H04R 3/02* (2006.01)
*G08B 23/00* (2006.01)
*G08B 1/08* (2006.01)

(52) U.S. Cl. ...... 381/57; 381/73.1; 381/107; 340/573.1; 340/539.15

(58) Field of Classification Search ............ 381/57, 381/56, 74, 334, 110, 122, 73.1, 61, 71.3, 381/107; 382/312, 313; 463/35; 340/573.1, 340/539.15
See application file for complete search history.

(56) References Cited

U.S. PATENT DOCUMENTS

| | | | |
|---|---|---|---|
| 4,306,115 A | | 12/1981 | Humphrey |
| 4,553,257 A | * | 11/1985 | Mori et al. ............... 381/57 |
| 4,628,526 A | | 12/1986 | Germer |
| 5,666,426 A | | 9/1997 | Helms |
| 5,839,109 A | * | 11/1998 | Iwamida .............. 704/271 |
| 5,907,622 A | | 5/1999 | Dougherty |
| 6,169,807 B1 | | 1/2001 | Sansur |
| 6,370,254 B1 | | 4/2002 | Gore et al. |

(Continued)

FOREIGN PATENT DOCUMENTS

WO    WO 97/08896 A1    3/1997

(Continued)

OTHER PUBLICATIONS

Notification of Transmittal of the International Search Report and the Written Opinion of the International Searching Authority, or the Declaration, International Search Report, and Written Opinion of the International Searching Authority, PCT/US2006/046429, Mar. 13, 2007.

(Continued)

*Primary Examiner* — Vivian Chin
*Assistant Examiner* — Douglas J Suthers
(74) *Attorney, Agent, or Firm* — Myers Bigel Sibley & Sajovec, P.A.

(57) ABSTRACT

An audio/video reproducing system is automatically electronically controlled in response to specific sensed sounds, specific sensed images and/or specific sensed patterns of nonvisible electromagnetic radiation that are identified electronically from a predefined set of specific sounds, a predefined set of specific images and/or a predefined set of electromagnetic radiation patterns. User preferences may be set to identify specific combinations of sensed patterns. The sensed patterns may be ambient sensed patterns and/or remote sensed patterns. Related systems, methods and computer program products are also described.

12 Claims, 3 Drawing Sheets

U.S. PATENT DOCUMENTS

| | | | |
|---|---|---|---|
| 6,894,714 B2 * | 5/2005 | Gutta et al. | 348/14.07 |
| 7,171,294 B2 * | 1/2007 | Kindo et al. | 701/36 |
| 2001/0046304 A1 * | 11/2001 | Rast | 381/74 |
| 2003/0013495 A1 | 1/2003 | Oleksy | |
| 2003/0096580 A1 | 5/2003 | Kaplan | |
| 2003/0222508 A1 * | 12/2003 | Maxwell et al. | 307/125 |
| 2005/0175194 A1 | 8/2005 | Anderson | |
| 2007/0092087 A1 * | 4/2007 | Bothra et al. | 381/74 |

FOREIGN PATENT DOCUMENTS

| | | |
|---|---|---|
| WO | WO 2004/104960 A1 | 12/2004 |

OTHER PUBLICATIONS

"New computerized micro-technology regulator . . . a TV advertiser's nightmare!", http://www.emrkt.com/comtrad/tvsound.html, downloaded Aug. 31, 2005, 3 pp.

Research Lab, "Auto Volume Control V2.0—Solves the volume control problems", http://www.research-lab.com/avcdsp02read.htm, downloaded Aug. 31, 2005, 2 pp.

Smarthome, "Stop Loud Commercials and Annoying Volume Changes", http://www.smarthome.com/7848T.html, downloaded Aug. 31, 2005, 2 pp.

* cited by examiner

AUDIO/VIDEO REPRODUCING SYSTEMS, METHODS AND COMPUTER PROGRAM PRODUCTS THAT MODIFY AUDIO/VIDEO ELECTRICAL SIGNALS IN RESPONSE TO SPECIFIC SOUNDS/IMAGES

FIELD OF THE INVENTION

This invention relates to electronic systems, methods and computer program products, and more particularly to audio/video reproducing systems, methods and/or computer program products.

BACKGROUND OF THE INVENTION

Audio/video reproducing systems are widely used in many consumer and commercial environments. As is well known to those having skill in the art, an audio/video reproducing system includes an audio/video electronics system that is configured to produce audio/video electrical signals from an audio/video program source. The audio/video program source may include a live program source such as AM/FM radio, satellite radio, broadcast television, cable radio, cable television and/or other conventional live program sources. The audio/video program source may also include stored audio/video program sources such as hard drives, CDs, DVDs, tape, solid state storage and/or other conventional stored audio/video program sources. An audio/video reproducing system may also include an electrical-to-audio/video transducer, including one or more displays (such as a television or monitor) and/or one or more speakers (loudspeakers and/or earspeakers) that are configured to convert the audio/video signals into sounds and/or images. Audio/video reproducing systems include audio only, video only and combined audio and video reproducing systems.

As is also well known to those having skill in the art, an audio/video reproducing system may be fixed, mounted in a vehicle and/or portable. Fixed audio/video reproducing systems may be provided in a home or commercial environment, and may include home stereo, home theater and/or computer-based audio/video systems. Vehicular audio/video reproducing systems can include vehicle audio and/or vehicle video systems. Finally, portable audio/video reproducing systems can include well known disc-based or solid state storage-based systems and/or over-the-air reception systems, marketed, for example, by Sony under the Walkman™ designator, or by Apple under the iPod™ designator.

Finally, audio/video reproducing systems may be standalone systems or may integrated with other systems. Examples of integrated audio/video reproducing systems include home audio/video reproducing systems that are integrated with home automation systems, vehicular audio/video reproducing systems that are integrated with vehicular navigation systems, and portable audio/video reproducing systems that are integrated with cell phones or Personal Digital Assistants (PDAs). The design of audio/video reproducing systems is well known to those having skill in the art, and need not be described further herein.

It is known to control the sound volume of an audio/video reproducing system in response to changes in ambient noise. Ambient noise-sensitive audio/video systems are often used, for example, in vehicular audio systems to compensate for changes in road noise or other ambient conditions. Automatic volume control systems that are responsive to ambient conditions are described, for example, in U.S. Pat. Nos. 4,306,115; 4,553,257; 4,628,526; 5,666,426; 5,907,622; 6,169,807; 6,370,254; and U.S. Patent Application Publications 2003/0013495 and 2005/0175194. It is also known to increase or decrease the brightness of a video display, such as a television, in response to ambient lighting conditions, so as to maintain acceptable contrast in the display under varying ambient lighting conditions.

SUMMARY OF THE INVENTION

Audio/video reproducing systems according to some embodiments of the present invention include an audio/video electronics system that is configured to produce audio/video electrical signals from an audio/video program source. An ambient sound sensor also is provided. A signal processor is configured to identify specific ambient sounds selected from a predefined set of specific ambient sounds in response to the ambient sound sensor. As used herein, "predefined" means that the set exists before the identification is made, but the predefined set may be static, variable, adaptive, updated and/or learned. A controller is configured to control the audio/video electronics system to modify the audio/video electrical signals that are produced from the audio/video program source in response to the specific ambient sounds that are identified by the signal processor from the predefined set of specific ambient sounds. As used herein, to "modify" means to change the audio/video electrical signals that are produced by the audio/video program source in any way, including increasing/decreasing volume/brightness, turning a signal on/off, switching to another program source and/or combining, interleaving and/or substituting another signal with/for the audio/video electrical signals.

In some embodiments, an image sensor is also or alternatively provided, and the signal processor is further configured to identify specific images selected from a predefined set of specific images in response to the image sensor. The controller may be further configured to control the audio/video electronics system to modify the audio/video electrical signals that are produced from the audio/video program source in response to the specific ambient sounds and/or the specific images that are identified by the signal processor from the predefined set of specific ambient sounds and/or the predefined set of specific images. In still other embodiments, a nonvisible electromagnetic radiation sensor is additionally or alternatively provided, and the signal processor is further responsive to the nonvisible electromagnetic radiation sensor, to identify specific nonvisible electromagnetic radiation patterns selected from a predefined set of specific electromagnetic radiation patterns. The controller may be further configured to control the audio/video electronics system to modify the audio/video electrical signals that are produced from the audio/video program source, in response to the specific ambient sounds, the specific images and/or the specific nonvisible electromagnetic radiation patterns that are identified by the signal processor. In yet other embodiments, yet other sensors (non-audio/image/electromagnetic), such as a fire, smoke and/or carbon dioxide sensors, may be provided.

In still other embodiments of the present invention, an external sound/image/other sensor may be provided in addition to, or instead of, the ambient sound/image/other sensor, and the signal processor may be responsive to the ambient and/or external sensor(s), to identify specific combinations of ambient/external stimuli. The controller may be configured to control the audio/video electronics system to modify the audio/video electrical signals in response to the specific combinations of ambient/external stimuli that are identified by the signal processor. In yet other embodiments, the controller may also be configured to control a device that is external to the audio/video electronics system in response to specific sounds, images and/or radiation patterns that are identified. The external sensor(s) and/or the external device(s) may be directly connected to the signal processor and/or may be connected using a wired and/or wireless local and/or wide area network and/or other indirect connections.

In some embodiments, a training mode of operations may be provided, wherein the signal processor is trained to recognize the predefined sets of specific sounds, specific images and/or specific nonvisible electromagnetic radiation patterns. In still other embodiments, the predefined sets of specific sounds, images and/or nonvisible radiation patterns may be downloaded and/or may be prestored.

In yet other embodiments, the controller is further configured to store user preferences of combinations of specific sounds, images and/or patterns, and the controller can be responsive to the specific sounds, images and/or patterns that are sensed, as well as the user preferences that are stored. Accordingly, a user may specify how specific combinations of sounds, images and/or patterns may be responded to by the audio/video reproducing system.

Some specific examples of controlling the audio/video electronics system according to various embodiments of the present invention now will be described. For example, when the audio/video reproducing system is a portable audio/video reproducing system that includes earpiece acoustical transducers (earspeakers), the controller may be configured to modify the electrical signals that are produced from the audio/video program source to warn a wearer of the earpiece acoustical transducers of specific ambient sounds. In another example, the controller can increase or decrease the audio electrical signals to raise or lower the volume, can add a voice-synthesized message to the audio electrical signals, can add a text message to the video electrical signals and/or can add the specific ambient sounds to the audio electrical signals, in response to the specific sounds, images and/or patterns that are identified by the signal processor. As used herein, to "add" means to overlay (combine) or to replace the audio electrical signals and/or the video electrical signals with the voice-synthesized message, the text message, the specific ambient sounds and/or the specific images that were identified. Moreover, the terms "lower" or "decrease" include muting or deactivation (i.e., decreasing to zero) and the terms "raise" or "increase" include turning on or activating (i.e., increasing from zero).

In specific embodiments of the present invention, the specific ambient sounds may comprise a baby crying and/or a telephone and/or a bell ringing, and the controller is configured to control the audio/video electronics system to decrease the audio electrical signals, to add a voice-synthesized message to the audio electrical signals, to add a text message to the video electrical signals and/or the add the sounds of the baby crying and/or the telephone and/or bell ringing, in response to the baby crying and/or the telephone and/or bell ringing that are identified by the signal processor. In other specific embodiments, the specific ambient sounds comprise a user snoring, and the controller is configured to control the audio/video electronics system to mute the audio/video electrical signals in response to the user snoring that is identified by the signal processor. In still other embodiments, the specific ambient sounds comprise specific home appliance sounds, and the controller is responsive to the signal processor to control the audio/video electronics system, to increase the audio electrical signals in response to the specific home appliance sounds that are identified, to thereby mask the specific home appliance sounds.

In yet other specific embodiments, the specific ambient sounds may include a siren approaching, and the specific images may include blue lights flashing. The controller is configured to decrease (including to mute) the audio electrical signals, to add a voice-synthesized message to the audio electrical signals, to add a text message to the video electrical signals and/or to add the sounds of the siren approaching and/or the image of the blue lights flashing, in response to the siren approaching and blue lights flashing that are identified by the signal processor. Many other specific examples may be provided using signal processing techniques to identify specific sounds, images and/or patterns.

It will be understood by those having skill in the art that embodiments of the invention have been described above primarily with respect to audio/video reproducing systems. However, analogous audio/video reproducing methods also may be provided according to other embodiments of the present invention. Moreover, computer program products configured to automatically electronically control an audio/video reproducing system in accordance with various embodiments of the invention also may be provided.

DETAILED DESCRIPTION

The present invention now will be described more fully hereinafter with reference to the accompanying figures, in which embodiments of the invention are shown. This invention may, however, be embodied in many alternate forms and should not be construed as limited to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof. As used herein the term "and/or" includes any and all combinations of one or more of the associated listed items and may be abbreviated as "/". It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure.

The present invention is described below with reference to block diagrams and/or flowchart illustrations of methods, apparatus (systems) and/or computer program products according to embodiments of the invention. It is understood that a block of the block diagrams and/or flowchart illustrations, and combinations of blocks in the block diagrams and/or flowchart illustrations, can be implemented by computer program instructions. These computer program instructions may be provided to a processor of a general purpose computer, special purpose computer, and/or other programmable data processing apparatus to produce a machine, such that the instructions, which execute via the processor of the computer and/or other programmable data processing apparatus, create means for implementing the functions/acts specified in the block diagrams and/or flowchart block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the block diagrams and/or flowchart block or blocks.

The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions/acts specified in the block diagrams and/or flowchart block or blocks.

Accordingly, the present invention may be embodied in hardware and/or in software (including firmware, resident software, micro-code, etc.). Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block may be separated into multiple blocks and/or the functionality of two or more blocks may be at least partially integrated.

Figure 1:
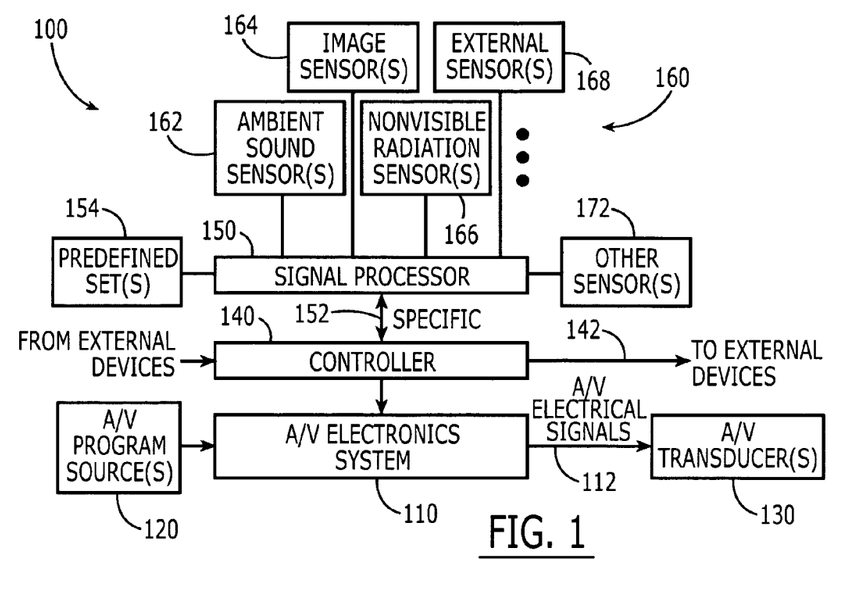
FIG. 1 is a block diagram of audio/video reproducing systems, methods and/or computer program products according to various embodiments of the present invention.

FIG. 1 is a block diagram of audio/video reproducing systems, methods and/or computer program products according to various embodiments of the present invention. As shown in FIG. 1, these audio/video reproducing systems, methods and/or computer program products 100 include an audio/video electronics system 110 that is configured to produce audio/video electrical signals 112 from one or more audio/video program sources 120. One or more audio/video transducers 130 also may be provided.

The audio/video electronics system may include amplifiers, switching circuits, processors, filters, selectors, controllers and/or other conventional audio/video electronics circuitry. The audio/video program sources 120 can include broadcast, stored and/or other conventional program sources. Finally, the audio/video transducer 130 can include one or more speaker systems and/or one or more display screens. The design of the audio/video program sources 120, the audio/video electronics system 110 and the audio/video transducers 130 are well known to those having skill in the art and need not be described further herein. Moreover, the functionality of the audio/video program sources 120, the audio/video electronics system 110 and the audio/video transducers 130 may be separated into multiple units and/or may be integrated into one or more units, depending on the application.

Still continuing with the description of FIG. 1, audio/video reproducing systems, methods and/or computer program products 100 according to various embodiments of the present invention include one or more sensors 160. The sensors 160 can include one or more ambient sound sensors 162, one or more image sensors 164, one or more nonvisible radiation sensors 166, one or more external or remote sensors 168 and one or more other sensors 172. A signal processor 150 is responsive to one or more of the sensors, to identify specific sounds, images, nonvisible radiation patterns and/or other specific patterns 152 selected from predefined sets 154 of specific sounds, images, nonvisible radiation patterns and/or other specific patterns. The sensors may be directly connected to the signal processor 150 and/or may be connected using a wired and/or wireless local and/or wide area network and/or other indirect connections. A controller 140 is responsive to the signal processor 150 to control the audio/video electronics system 110, to modify the audio/video electrical signals 112 that are produced from the audio/video program source(s) 120 in response to the specific sounds, images, nonvisible radiation patterns and/or other patterns that are identified by the signal processor 150. The predefined sets 154 may be stored in one or more memory devices using techniques well known to those having skill in the art. The predefined sets that are stored may be static or may be dynamically updated as new information is received and/or generated.

The ambient sound sensors 162 may include one or more microphones. The image sensors 164 may include one or more cameras, such as charge-coupled device (CCD) cameras and/or other image sensors. Nonvisible radiation sensors 166 may include infrared image sensors, ultraviolet infrared image sensors, radiofrequency sensors and/or other nonvisible radiation sensors. External sensors 168 may be used to remotely sense sound, images, nonvisible radiation patterns and/or other patterns that occur remote from the audio/video reproducing system, method and/or computer program product 100. Other ambient and/or remote sensors 122, such as pressure, liquid and/or chemical sensors, also may be provided. The design of the individual sensors 160 is well known to those having skill in the art. Moreover, multiple purpose sensors also may be employed.

The signal processor 150 may be employed to identify specific patterns 152 from the sensors 160 that are selected from the predefined sets 154. The signal processor 150 may operate by pattern matching signals that are provided by the sensors 160 against various matching stored patterns 154 using conventional signal processing techniques well known to those having skill in the art, in order to identify specific patterns 152. As is well known, the stored patterns may be predefined, updateable and/or adaptive, and new patterns may also be added from external sources and/or in response to past actions. Accordingly, the signal processor 150 may have learning capabilities.

The controller 140 is responsive to the signal processor 150 to control the audio/video electronics system 110, to modify the audio/video electrical signals 112 that are produced from the audio/video program source 120, in response to the specific patterns 152 that are identified by the signal processor 150. External devices also may be controlled, as shown by signal 142. External signals 144 also may be used by the controller 140 as a basis to modify the audio/video electrical signals 112. It will be understood that the functionality of the signal processor 150 and the controller 140 may be at least partially integrated into a single unit and/or may be separated into various subunits. Moreover, the signal processor 150 and/or controller 140 may also be integrated, at least in part, into the audio/video electronics system 110, the audio/video transducers 130 and/or the audio/video program sources 120. Accordingly, the block diagram of FIG. 1 represents a functional block diagram, and should not be construed as requiring discrete devices.

Some embodiments of the present invention may arise from recognition that digital signal processing circuitry may be used to allow greater degrees of automatic electronic control over an audio/video system than may have been heretofore possible, by electronically identifying or recognizing specific patterns or combinations of patterns of sounds, images, nonvisible radiation and/or other patterns that are selected from sets of patterns (fixed, adaptive, updated and/or learned), and by automatically electronically controlling the audio/video reproducing system based on these identified patterns. Much more sophisticated control may be provided than conventional ambient noise-sensitive volume controls that are merely sensitive to the overall volume level of ambient noise, ambient light-sensitive contrast controls that are merely sensitive to the overall brightness of the ambient environment and/or motion sensors that are merely sensitive to motion in the vicinity of the sensor.

Embodiments of the present invention may be used with audio/video reproducing systems that are fixed, vehicular and/or portable. In a home environment, fixed audio/video reproducing systems, methods and/or computer program products 100 of FIG. 1 may be standalone stereo, video and/or home theater systems and/or may be integrated with an intercom, home automation, personal computer, security and/or other conventional home-based system. In vehicular systems, audio/video reproducing systems, methods and/or computer program products 100 according to various embodiments of the present invention may be integrated with cellular telephone, navigation and/or entertainment systems used in a vehicle. Moreover, in portable devices, audio/video reproducing systems, methods and/or computer program products 100 according to various embodiments of the present invention may be integrated with cellular telephones, Personal Digital Assistants (PDA), laptop or palmtop computers and/or portable media players, such as marketed under the well known Walkman™ or iPod™ designators.

Many specific examples of automatically electronically controlling an audio/video electronics system in response to specific patterns that are identified will now be described according to various embodiments of the present invention. Although each of these examples may identify potentially significant functionality that may be obtained according to various embodiments of the present invention, these examples shall not be construed as limiting the scope of the present invention.

Figure 2:
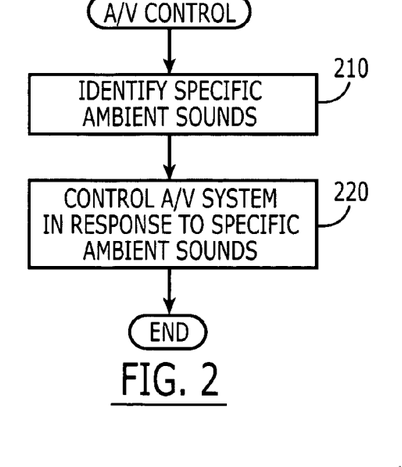
FIGS. 2-5 are flowcharts of operations that may be performed to control an audio/video reproducing system according to various embodiments of the present invention.

In particular, FIG. 2 illustrates embodiments of the present invention wherein specific ambient sounds are identified at Block 210, for example, using an ambient sound sensor 162, a signal processor 150 and a predefined set of specific ambient sounds 154 of FIG. 1. The identification may take place using conventional pattern matching techniques that can use one or more fixed and/or variable thresholds and/or other criteria to define a match. At Block 220, the audio/video (A/V) system is automatically electronically controlled in response to the specific ambient sounds that were identified from the set of predefined ambient sounds. At Block 220, the audio/video electronics system may be controlled to increase or decrease the audio electrical signals (i.e., raise or lower the volume, including muting the volume), to add (or replace) a voice-synthesized message to the audio electrical signals, to add a text message to the video electrical signals, to add the specific ambient sounds to the audio signals and/or to perform other specific operations in response to the specific ambient sounds that are identified by the signal processor.

In a specific example of FIG. 2, the specific ambient sounds may comprise a baby crying and/or a telephone and/or bell ringing, and the audio/video system is controlled at Block 220, to lower the audio electrical signals, so that the baby crying and/or telephone and/or bell ringing can be heard, to add a text message to the video electrical signals, such as "Baby Crying", "Telephone Ringing" and/or "Bell Ringing", to superimpose or replace the sound of the baby crying and/or telephone and/or bell ringing on or instead of the sounds of the audio/video system, and/or to provide a special alert tone and/or message in the audio/video electrical signals 112, so that they are reproduced by the audio/video transducers 130.

In still other specific embodiments of FIG. 2, the specific ambient sounds include a user snoring at Block 210. The audio/video system is controlled at Block 220 to discontinue the audio/video electrical signals 112 in response to the user snoring that was identified. In other embodiments, the audio/video electrical signals 112 may be slowly decreased and/or the audio/video electronics system 100 may be turned off immediately or after expiration of a timer from the time the user's snoring is detected.

In still other embodiments of FIG. 2, the specific ambient sounds include home appliance sounds, such as sounds of a vacuum cleaner, at Block 210. At Block 220, the audio/video system is controlled to increase the audio signals (i.e., raise the volume) in response to the home appliance sounds that are identified, to mask the home appliance sound.

In yet other embodiments of FIG. 2, when the audio/video reproducing system, method and/or computer program product 100 is vehicular or portable, the specific ambient sounds can comprise the sound of an emergency vehicle siren. In some embodiments, Doppler detection may be used by the signal processor 150 to detect the sound of a siren that is approaching rather than receding. In these embodiments, the audio/video electronics system 110 may be controlled to lower the audio and/or video electrical signals, to add a voice-synthesized message to the audio signals, to add a text message to the video electrical signals and/or to add the sounds of the siren approaching to the audio/video electrical signals. It will be understood by those having skill in the art that it may be problematic for a vehicle driver or a user of a personal audio system, who is playing music loudly, to hear the sound of an oncoming siren, which may impact the user's personal safety. Embodiments of the present invention can use digital signal processing techniques to specifically identify the sound of an approaching siren and thereby control the audio/video electronic system to warn the user.

Figure 3:
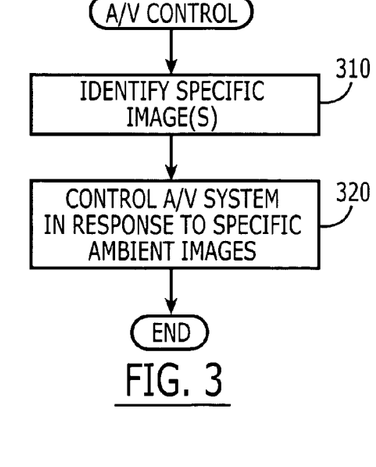

FIG. 3 illustrates other embodiments of the present invention, wherein at Block 310, a signal processor, such as a signal processor 150 of FIG. 1, is responsive to an image sensor, such as the image sensor 164 of FIG. 1, to identify specific images, and wherein a controller, such as a controller 140 of FIG. 1, is configured to control the audio/video electronics system, such as the audio/video electronics system 110 of FIG. 1, to modify the audio/video electrical signals that are produced in response to the specific images that are identified by the signal processor. For example, in some embodiments of FIG. 3, an image of a specific user may be identified and the audio/video electronics system 110 may be configured to activate a preferred audio/video program source and/or a preferred channel of a preferred audio/video program source, in response to the image of the user. Thus, digital signal processing allows an audio/video reproducing system to be controlled not merely by sensing the presence or movement of a user, but by identifying the specific user and tailoring the audio/video content in response thereto. The audio/video system can be controlled at Block 320 in any of the ways that were described in connection with Block 220, and/or in many other ways, in response to the specific image that was identified by the signal processor.

Moreover, embodiments of FIGS. 2 and 3 may be combined so that the system is controlled in response to identification of specific sounds and identification of specific images. For example, the combination of a siren approaching and flashing blue lights may be used to identify an approaching emergency vehicle, rather than just the sound of the siren. In another example, the sounds of a baby crying may be combined with an image of the baby, to identify whether the crying is random or in response to a pain/danger, and to modify the audio/video electrical signal accordingly. In another example, the sound of the telephone ringing and an image of no other family member answering the telephone may be used to modify the audio/video electrical signals. It will also be understood that an image and/or sound that is identified may be less than an entire image/sound field. Thus, for example, a portion of an image or a single sound in a sound field may be used to control the system. Thus, subcomponents of a sensed frame or information set may be acted upon.

Figure 4:
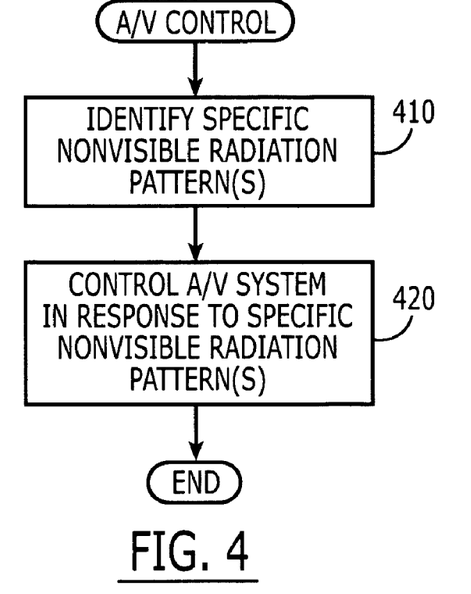

Other embodiments of the invention are described in FIG. 4. In FIG. 4, specific nonvisible radiation patterns are identified at Block 410 using, for example, the signal processor 150 and the nonvisible radiation sensor 166 of FIG. 1. At Block 420, the audio/video system is controlled in response to the specific nonvisible radiation patterns, for example using a controller 140 of FIG. 1. The specific nonvisible radiation patterns may be infrared patterns, which can indicate the presence of an individual in the dark and/or the presence of fire. In response to specific nonvisible radiation patterns, the audio/video system may be controlled at Block 420 similar to operations that were described at Blocks 220 and 330.

Moreover, combinations and subcombinations of embodiments of FIGS. 2-4 may be used to control an audio/video reproducing system in response to various combinations and subcombinations of specifically identified sounds, images, other nonvisible radiation patterns and/or other identified patterns that are selected from predefined sets of sounds, images, other nonvisible radiation patterns and/or other patterns.

Embodiments of FIGS. 2-4 have been described above primarily with respect to identification of specific ambient sounds, ambient images and/or ambient nonvisible radiation patterns. As used herein, "ambient" means in the general proximity of the audio/video electronics system 110. However, other embodiments of the present invention can use external sensors, such as external sensors 168, to identify sounds, images, nonvisible radiation patterns and/or other patterns that are remote from the audio/video electronics system itself, and to use these patterns alone or in combination with ambient sound, image, nonvisible radiation and/or other patterns.

Specific combinations may be used in response to user preferences. For example, the sound of a doorbell coupled with the sensed image of a specific user of the audio/video electronic system, and further coupled with the sensed image of a specific individual at the door, may be used to control the audio/video electronic system in one specified manner, whereas other combinations of the doorbell ringing, identification of a user of the audio/video system and identification of a visitor at the door may be used to trigger other responses. Similarly, the remote sensing of an image of a baby awakening may trigger different responses, depending upon the image of the user of the audio/video system that is sensed. Accordingly, various combinations of ambient and/or external sounds, images, nonvisible radiation patterns and/or other patterns may be used based upon predefined user preferences and/or other criteria, to control the audio/video system. Finally, other types of sensors 172 may also be used, alone or in combination with the sensors described above. Other sensors may include chemical sensors, such as gas or smoke detectors that may detect gas and/or smoke in the ambient and/or remote from the ambient.

Moreover, user preferences may be used to control the audio/video reproducing system in other scenarios. For example, as was described above in connection with FIG. 3, an image of a specific user may be identified and the audio/video electronics system 110 may be configured to activate a preferred audio/video program source and/or a preferred channel of a preferred audio/video program source in response to the image of user. Stored user preferences may also be used to activate a preferred audio/video program source and/or a preferred channel of the preferred audio/video program source depending upon the time of day, day of week, whether the user is alone and/or other preferences that are predefined by the user. Accordingly, user preferences may specify specific combinations of patterns and/or may add other criteria, such as time of day, time of week, or time of year, to control the audio/video system. In a "time of year" example, the presence of a given user may be sensed to cause the audio/video system to play Christmas music during the Christmas season. User preferences may be provided to the controller 140 of FIG. 1 as external device signals 144, and may be obtained from the user by a conventional user interface.

Embodiments of FIGS. 2-4 have also been described above in connection with control of an audio/video reproducing system itself. However, any of the embodiments described above and/or other embodiments may also be used to control external devices, as indicated by signal 142 of FIG. 1. These external devices can include a telephone that can be controlled to answer an incoming phone call, a door lock that can be controlled to open a door, a vehicle cruise control that can be disabled, an appliance, such as a stove or cooktop that can be disabled, and/or many other external devices. In other embodiments, the police, fire department or other authorities may be automatically called in response to a specific set of signals.

Figure 5:
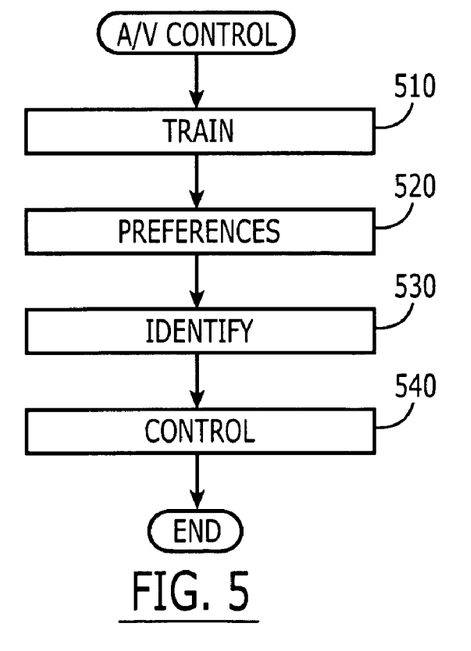

FIG. 5 is a flowchart of operations that may be performed to control audio/video reproducing systems according to still other embodiments of the present invention. Embodiments of FIG. 5 recognize that when signal processing is used to identify specific sounds, images, nonvisible radiation patterns and/or other patterns, it may be desirable to train the signal processor to recognize the various patterns to be identified. Accordingly, as illustrated in Block 510, a training mode may be entered, in which the system is trained to recognize specific patterns, such as that of a specific doorbell, a specific child's voice, images of family members, etc. After the training mode has been employed, these stored sets of patterns, such as the predefined sets 154 of FIG. 1, may be used to identify specific sounds, images, nonvisible radiation patterns, etc. The training mode may be used upon initial deployment and/or whenever sets of patterns to be recognized are updated or changed. It will also be understood that, in other embodiments, downloaded or default sets of patterns may be used for comparison purposes. Thus, for example, a default and/or downloaded sound of a siren or a telephone may be used for the predefined sets 154 of FIG. 1, to thereby reduce or eliminate the need for training to identify certain patterns.

Moreover, as shown in Block 520, user preferences may be accepted to identify a specific response for the controller 140 in response to specific sensed combinations of sensed signals and/or other parameters. Preferences may be set for every user of the system and for many combinations of specifically identified sounds, images, nonvisible radiation patterns and/or other patterns. However, it will also be understood that, in other embodiments, predefined preferences may be stored and/or downloaded, which can be used for default control in the absence of specific preferences. At Block 530, a signal processor is responsive to the sensors and/or preferences, to identify specific patterns. The audio/video system is then controlled at Block 540, as was described above in connection with Blocks 220-420.

Signal processing of ambient and/or remote signals to identify specific patterns, according to various embodiments of the invention, may be viewed as a form of "event analysis" or "comparative analysis", which can allow an audio/video reproducing system to be controlled in more sophisticated ways than may have been heretofore possible. By identifying specific events and coupling this identification with user preferences, enhanced control of an audio/video reproducing system and/or other external devices may be provided. For example, as was described above, a driver in a vehicle having an audio/video system, or a wearer of a personal audio/video system may be isolated from the environment. However, embodiments of the present invention can allow the relative isolation of the driver or user to be maintained, but can allow warnings to be presented to the driver or wearer in response to identification of specific emergency situations. Moreover, an interactive system may be provided, wherein prior user responses to the control of the audio/video reproducing system may be used to define preferences for future responses to similar sets of signals. For example, if the sound and picture of an audio/video system is lowered in response to detecting a specific user snoring, and the user then raises the sound volume and picture brightness, subsequent occurrences of detecting the specific user snoring can be ignored, or a delay can be inserted before reducing the sound and/or picture. Thus, a user's preferences may be adaptively updated and stored, so as to allow increases in accuracy and/or efficiency over time.

Other embodiments of the present invention can allow multiple audio/video reproducing systems to collaborate with one another, to define a reaction of a given audio/video reproducing system for an individual user, or for a group of users, based on collaborative inputs and/or collaborative user preferences. For example, signals 142 from other devices may be used as an input to control the audio/video reproducing system. In another example, the audio/video reproducing system may be used to control another system. Accordingly, collaborative user preferences and/or collaborative control may be provided, according to various embodiments of the present invention. Accordingly, a user's environment can be customized based on the user's own taste and/or external stimuli that are occurring in the environment.

Some embodiments of the present invention may be used by handicapped persons, wherein inputs of one type can be used to control the audio/video system, to provide outputs of another type. Thus, upon sensing the telephone ringing, a visible message may be provided on a monitor, so that a deaf person is alerted to the phone ringing. Conversely, an audible sound may be provided by the audio/video reproducing system upon detecting a person approaching, to thereby warn a blind person.

As was described above, embodiments of the present invention may be used with portable (i.e., personal) audio/video reproducing systems, also referred to herein as personal media devices. As was described above, personal media devices may generally exclude external audible and/or visual stimuli that may be useful for warning or self-preservation. These personal devices are often viewed and/or played at relatively high levels, so as to cancel out the impact of the ambient. Thus, for example, a user with earbud headphones listening to an MP3 player may be oblivious to a loud truck coming up from behind. The user may not step out of the way, and may be hurt. In another environment, a user with a Bluetooth or other ad-hoc short-range wireless headset for a cell phone may be concentrating on a phone call, and may not notice three people approaching rapidly, possibly with bad intent.

However, according to various embodiments of the present invention, a microphone may be provided on the personal media device and/or separate from the personal media device, that can be coupled to a signal processor that performs comparative analysis, to identify specific sounds that may constitute a danger, such as the sound of a siren approaching, or of a truck or people approaching. The media player may say and/or display "Warning", or provide other audio/video warnings of the event. A simple vibrating alert, as is provided by conventional game controllers and/or cell phones, may be used. Other embodiments may also provide a near field sensing solution to detect persons approaching the personal media device. Proximity sensing may be used by detecting specific sounds, infrared signals, radio frequency signals and/or images.

Figure 6:
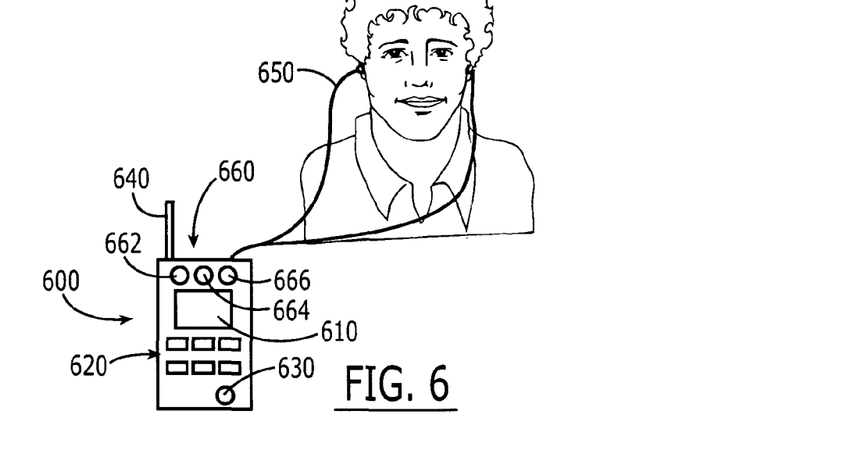
FIG. 6 illustrates a personal audio/video reproducing system that may be controlled according to various embodiments of the present invention.

For example, as shown in FIG. 6, a personal media player 600 may include a display screen 610, a keypad 620, a microphone 630, an antenna 640 and earbuds 650 that are worn by a user. One or more external sensors 660, such as a microphone 662, a camera 664 and/or an infrared sensor 666 may be provided and coupled to a signal processor in the personal media device 600, to identify specific sounds, images and/or infrared signals. The external sensors 660 may be collocated but spaced apart from the other input/output components of the device. For example, in a cell phone, the ambient level sensing microphone may be different from the primary cell phone conversation microphone, and may be spaced apart from the primary cell phone conversation microphone so as to capture the ambient. Similarly, a separate video camera from the primary video camera on a cell phone may be used that can be directed to the ambient environment and not to the user of the cell phone. Messages may be played to the user over the earbuds 650, to indicate a horn, a siren (by itself or only when coupled with flashing lights) and/or the approaching of multiple people who may be intent on doing harm.

Figure 7:
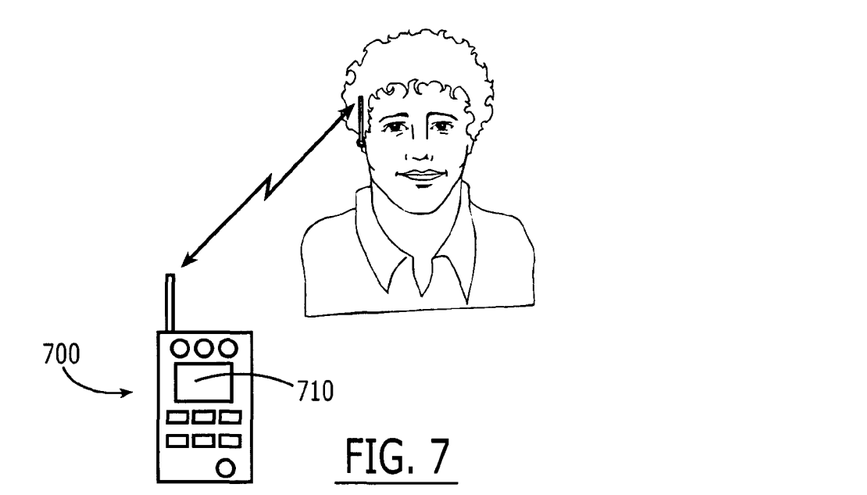
FIG. 7 illustrates a personal warning device that may be provided according to various embodiments of the present invention.

As also shown in FIG. 7, these embodiments of the present invention also may be used with a cellular telephone 700, which may employ an ad-hoc short-range wireless headset 720, so as to alert a user talking on the cellular telephone 700 of an impending danger. Thus, in some embodiments, the conversation on a cellular telephone may be interrupted by the sound of a horn honking (synthesized or reproduced), the sound of a siren (synthesized or reproduced) and/or a voice-synthesized warning message that can be general or that can identify a specific warning. A warning message also may be generated based on sensing one or more individuals proximate to the user.

Figure 8:
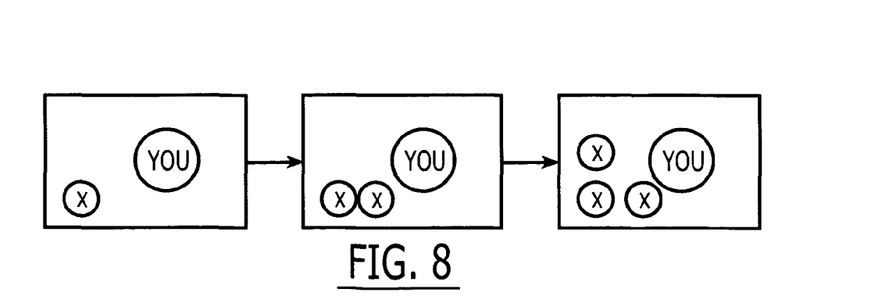
FIG. 8 illustrates range-finding displays that may be provided in a personal warning device according to various embodiments of the present invention.

As also shown in FIG. 7, in other embodiments, a display 710 of a cell phone 700 also may display an indication of the warning, such as the display of a warning message or a display of a map indicating the user's location and the location of people around the user. Moreover, the locations may be tracked over time, and the user's response may also be tracked over time, to determine preferences for future processing. A personal protection system thereby may be provided. FIG. 8 illustrates an example of how a display 710 of FIG. 7 can change over time to provide a personal warning system.

In still other embodiments, collaborative sharing of sensor data and/or control data may also be used to communicate a latest known threat using specific "threat media" content that can be transmitted dynamically and/or in real time. For example, an image of a threatening individual can be shared among a group of users by successively transmitting that specific piece of content along the general path and direction of the threat from user to next user, along with the movement of the threat and/or preemptively in the general direction of movement. Various prediction algorithms, such as linear predictive algorithms that are known to those having skill in the art, may be used. Accordingly, a potentially useful piece of audio and/or video content can travel from user to user along with a moving threat and/or ahead of the threat so as to be preemptive.

Accordingly, embodiments of the present invention can control an audio/video reproducing system, in response to specific patterns of sounds, images, nonvisible electromagnetic radiation and/or other stimuli that are detected from a predefined set of specific patterns of sounds, images, nonvisible electromagnetic radiation and/or other stimuli. In some embodiments, personal warning systems may be provided. In other embodiments, systems, methods and/or computer program products are provided for dynamically sensing, managing and/or optimizing ambient environment interaction to a set of stimuli. Competing stimuli can thereby be managed in a high stimuli environment. Selective non-noise canceling audio devices may also be provided, by creating an intelligent sound admission or cancellation effect based on a collection of desired rich media descriptors.

It will be understood that embodiments of the invention have been described herein primarily in connection with audio/video reproducing systems. However, any of the above-described embodiments may also be used to control systems other than audio/video reproducing systems in response to specific patterns of stimuli that are identified. For example, a home security system or an access control system may be controlled.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. An audio reproducing system comprising:
   an audio electronics system that is configured to produce audio electrical signals from an audio program source;
   an ambient sound sensor that is configured to detect ambient sound;
   a signal processor that is configured to identify specific ambient sounds selected from a predefined set of specific ambient sounds in response to the ambient sound detected by the ambient sound sensor; and
   a controller that is configured to control the audio electronics system to modify the audio electrical signals that are produced from the audio program source in response to the specific ambient sounds that are identified by the signal processor;
   wherein the specific ambient sounds comprise a baby crying and specific home appliance sounds; and
   wherein the controller is configured to control the audio electronics system to decrease the audio electrical signals in response to the baby crying that is identified by the signal processor, and to increase the audio electrical signals in response to the specific home appliance sounds that are identified by the signal processor to mask the specific home appliance sounds.

2. An audio reproducing system according to claim 1 further comprising:
   an image sensor that is configured to capture images;
   wherein the signal processor is further configured to identify specific images selected from a predefined set of specific images in response to the images captured by the image sensor; and
   wherein the controller is further configured to control the audio electronics system to modify the audio electrical signals that are produced from the audio program source in response to the specific ambient sounds and the specific images that are identified by the signal processor.

3. An audio reproducing system according to claim 2 further comprising:
   a nonvisible electromagnetic radiation sensor that is configured to capture nonvisible electromagnetic radiation;
   wherein the signal processor is further configured to identify specific nonvisible electromagnetic radiation patterns selected from a predefined set of specific electromagnetic radiation patterns in response to the nonvisible electromagnetic radiation captured by the nonvisible electromagnetic radiation sensor; and
   wherein the controller is further configured to control the audio electronics system to modify the audio electrical signals that are produced from the audio program source in response to the specific ambient sounds, the specific images and the specific nonvisible electromagnetic radiation patterns that are identified by the signal processor.

4. An audio reproducing system according to claim 1 wherein the audio reproducing system is a portable audio reproducing system that further comprises earpiece acoustical transducers and wherein the controller is configured to modify the electrical signals that are produced from the audio program source to warn a wearer of the earpiece acoustical transducers of specific ambient sounds.

5. An audio reproducing system according to claim 1 further comprising an electrical-to-audio transducer that is configured to convert the audio signals that are modified into sounds.

6. An audio reproducing system according to claim 1 wherein the controller is further configured to train the signal processor to recognize the specific ambient sounds in a training mode of operations.

7. An audio reproducing system according to claim 1 wherein the controller is further configured to control the signal processor to download the specific ambient sounds.

8. An audio reproducing system according to claim 1 further comprising:
- an external sound sensor that is configured to detect external sound;
- wherein the signal processor is configured to identify specific ambient and external sounds selected from a predefined set of specific sounds in response to the external sound detected by the ambient sound sensor and the external sound sensor; and
- wherein the controller is configured to control the audio electronics system to modify the audio electrical signals that are produced from the audio program source in response to the specific ambient sounds and external sounds that are identified by the signal processor.

9. An audio reproducing system according to claim 1 wherein the controller is further configured to control a device that is external to the audio electronics system in response to the specific ambient sounds that are identified by the signal processor.

10. An audio reproducing system according to claim 1 further comprising a video reproducing system that is configured to produce video electrical signals from a video program source, wherein the controller is configured to control the video electronics system to add a text message to the video electrical signals in response to the baby crying that is identified by the signal processor.

11. An audio reproducing system according to claim 1:
- wherein the specific ambient sounds further comprise a user snoring; and
- wherein the controller is configured to control the audio electronics system to discontinue the audio electrical signals in response to the user snoring that is identified by the signal processor.

12. An audio reproducing system according to claim 1 wherein the controller is further configured to increase ambient lighting external to the audio reproducing system in response to the baby crying that is identified by the signal processor.

* * * * *